United States Patent
Matsushima et al.

(10) Patent No.: US 11,419,210 B2
(45) Date of Patent: Aug. 16, 2022

(54) RESIN COMPOSITION, METAL FOIL PROVIDED WITH RESIN LAYER, METAL CLAD LAMINATE, AND PRINTED WIRING BOARD

(71) Applicant: MITSUI MINING & SMELTING CO., LTD., Tokyo (JP)

(72) Inventors: Toshifumi Matsushima, Saitama (JP); Tetsuro Sato, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 671 days.

(21) Appl. No.: 14/396,848

(22) PCT Filed: Apr. 24, 2013

(86) PCT No.: PCT/JP2013/062123
§ 371 (c)(1),
(2) Date: Oct. 24, 2014

(87) PCT Pub. No.: WO2013/161905
PCT Pub. Date: Oct. 31, 2013

(65) Prior Publication Data
US 2015/0140296 A1    May 21, 2015

(30) Foreign Application Priority Data
Apr. 27, 2012 (JP) .............. JP2012-104046

(51) Int. Cl.
| | |
|---|---|
| *H05K 1/05* | (2006.01) |
| *C08L 71/12* | (2006.01) |
| *C08L 53/02* | (2006.01) |
| *H05K 1/03* | (2006.01) |
| *H05K 3/02* | (2006.01) |
| *C08K 3/20* | (2006.01) |
| *C08K 3/22* | (2006.01) |
| *C08K 3/013* | (2018.01) |
| *C08L 47/00* | (2006.01) |
| *C08K 5/37* | (2006.01) |
| *C08K 5/01* | (2006.01) |

(52) U.S. Cl.
CPC .............. *H05K 1/056* (2013.01); *C08L 53/02* (2013.01); *C08L 71/12* (2013.01); *H05K 1/0326* (2013.01); *C08K 3/013* (2018.01); *C08K 3/20* (2013.01); *C08K 5/01* (2013.01); *C08K 5/37* (2013.01); *C08K 2003/2206* (2013.01); *C08K 2003/2237* (2013.01); *C08L 47/00* (2013.01); *C08L 2203/20* (2013.01); *H05K 1/0353* (2013.01); *H05K 1/0373* (2013.01); *H05K 3/022* (2013.01); *H05K 2201/0137* (2013.01); *H05K 2201/0145* (2013.01); *H05K 2201/0209* (2013.01); *H05K 2201/0355* (2013.01); *H05K 2201/0358* (2013.01); *Y10T 428/24917* (2015.01); *Y10T 428/31696* (2015.04)

(58) Field of Classification Search
CPC ...... H05K 1/0373; H05K 1/056; H05K 3/022; H05K 2201/0209; C08L 71/12; C08L 53/02
See application file for complete search history.

(56) References Cited

U.S. PATENT DOCUMENTS

| | | | | |
|---|---|---|---|---|
| 3,923,929 A | * | 12/1975 | Wright | ........... C08F 283/08 524/485 |
| 4,518,764 A | * | 5/1985 | Tanaka | ........... C08G 61/12 528/271 |
| 5,284,807 A | | 2/1994 | Komori et al. | |
| 5,334,645 A | | 8/1994 | Komori et al. | |
| 5,407,872 A | | 4/1995 | Komori et al. | |
| 2001/0030022 A1 | * | 10/2001 | Ishimatsu | ........... C09J 4/00 156/332 |
| 2007/0129502 A1 | * | 6/2007 | Kawabe | ........... B32B 15/08 525/391 |
| 2010/0129676 A1 | | 5/2010 | Fujimoto | |
| 2010/0252310 A1 | * | 10/2010 | Kojima | ........... H05K 3/4655 174/258 |

(Continued)

FOREIGN PATENT DOCUMENTS

| | | |
|---|---|---|
| JP | H01189999 A | 7/1989 |
| JP | H01215851 A | 8/1989 |

(Continued)

OTHER PUBLICATIONS

Diallyl phthalate, https://pubchem.ncbi.nlm.nih.gov/compound/Diallyl-phthalate, retrieved 2020, PubChem, pp. 1, 7, 22, 27, 29 (Year: 2020).*

(Continued)

*Primary Examiner* — Vivian Chen
(74) *Attorney, Agent, or Firm* — Greenblum & Bernstein, PLC

(57) ABSTRACT

An object of the present invention is to provide a resin composition which enables formation of a resin layer having excellent electrical performance including high frequency performance and appropriate solubility with desmear solution required on a material used in manufacturing of a printed wiring board. To achieve the object, the resin composition used for constituting a resin layer on a metal layer surface of a laminate includes a polyphenylene ether compound and 10 parts by mass to 100 parts by mass of a styrene-butadiene block copolymer and 0.1 parts by mass to 100 parts by mass of a component promoting solubility with desmear solution against 100 parts by mass of the polyphenylene ether compound.

11 Claims, No Drawings

(56) References Cited

U.S. PATENT DOCUMENTS

2010/0279217 A1* 11/2010 Yu .................... G03G 5/0564
430/58.8
2013/0040153 A1   2/2013 Fujimoto

FOREIGN PATENT DOCUMENTS

| JP | H01215852 A | 8/1989 |
| JP | H03275760 A | 12/1991 |
| JP | H0563323 A | 3/1993 |
| JP | 06-052716 A | 2/1994 |
| JP | 07-182921 A | 7/1995 |
| TW | 200904896 | 2/2009 |
| WO | 2009/008471 A1 | 1/2009 |

OTHER PUBLICATIONS

Taiwanese Office Action issued with respect to application No. 102114960, dated Jan. 12, 2015.

* cited by examiner

RESIN COMPOSITION, METAL FOIL PROVIDED WITH RESIN LAYER, METAL CLAD LAMINATE, AND PRINTED WIRING BOARD

TECHNICAL FIELD

The present invention relates to a resin composition used for constituting a resin layer of a laminate including a metal clad laminate in which a resin layer is provided on the metal layer surface, a metal foil provided with a resin layer formed by using the resin composition, a metal clad laminate and a printed wiring board.

BACKGROUND ART

Conventionally, a metal foil provided with a resin layer has been used as a material used in manufacturing of a multilayer printed wiring board. The resin layer of a metal foil provided with a resin layer is used as an insulating layer or an adhesive layer, and the metal foil is used as a conductor layer for formation of a conductor pattern. Depending on downsizing, speed-up and multi-functional design of an electronic device in recent years, a printed wiring board for mounting an electronic device has been multi-layered. Further, many of these electronic devices operates with signals of high frequency exceeding 1 GHz, i.e. signal processing is made high speed. The insulating layer for a high-frequency, high-speed circuit operating at high speed with such high-frequency signals is preferable to be constituted by an insulating material low in both dielectric constant and dielectric tangent to reduce the signal delay and the signal transmission loss. So, the resin layer of a metal foil provided with a resin layer is preferable to be an insulating material low in both dielectric constant and dielectric tangent.

Further, a capacitor circuit has been provided in the inner layer of a multilayer printed wiring board in recent years. The metal foil provided with a resin layer is used as a material for forming such an embedded capacitor. In some cases, the resin layer is used as a dielectric layer (See Patent Document 1: International Publication WO2009/008471). In this case, the higher dielectric constant of the dielectric layer makes formation of a capacitor having a larger capacitance easy. In contrast, if the dielectric loss and so on is considered, the dielectric layer is preferable to have low dielectric tangent and not too high dielectric constant. Although the dielectric performance required on a resin layer is different depending on the application of the resin layer, the material is required to be excellent in high frequency performance with a low dielectric tangent in any case.

SUMMARY OF THE INVENTION

Problems to be Solved

If manufacturing of a multi-layer printed wiring board employing build-up method uses the metal foil provided with a resin layer described above, holes including through-holes, blind via holes and so on (hereinafter, referred to as "Through Holes") are made by drilling or laser processing for interlayer connection. Then plating is carried out to make the inner wall of "Through Holes" and an inner layer wiring connect. If the resin (smears) remains in the "Through Holes", plating cannot secure reliability of the electrical connection among the inner layer wiring and the through holes. So, a desmear treatment chemically remove the smears by dissolving with a desmear solution including potassium permanganate and so on is generally carried out before plating. Note that if the resin layer is excessively soluble in the desmear solution, the resin around "Through Holes" sinks due to the dissolution progress of the resin layer in the desmear treatment. Such case is not preferable since adhesion between the resin layer and the conductor layer is locally made poor. In contrast, if the resin layer is less soluble in the desmear solution, a smear remains in "Through Holes" to fail connection among the inner layer wiring and "Through Holes".

The object of the present invention is to provide a resin composition which enables formation of a resin layer excellent in electrical performances including high frequency performance required on a material used in manufacturing of a printed wiring board and having an appropriate solubility with a desmear solution, a metal foil provided with a resin layer formed by using the resin composition, a metal clad laminate, and a printed wiring board.

Means to Solve the Problem

As a result of intensive studies, the present inventors have solved the problem by employing the following resin composition.

The resin composition used for constituting a resin layer of a laminate in which a resin layer is provided on the metal layer surface according to the present invention includes a polyphenylene ether compound and 10 parts by mass to 100 parts by mass of a styrene-butadiene block copolymer and 0.1 parts by mass to 100 parts by mass of a component promoting solubility with desmear solution against 100 parts by mass of the polyphenylene ether compound.

The resin composition according to the present invention is preferable to include one or more compounds selected from diallyl phthalate, (meth)acrylate, and unsaturated polyesters as the component promoting solubility with desmear solution.

The resin composition according to the present invention may include 0.1 parts by mass to 30 parts by mass of a curl lessen component against 100 parts by mass of the polyphenylene ether compound.

The resin composition according to the present invention may include 50 parts by mass to 600 parts by mass of dielectric particles against 100 parts by mass of the resin composition (excluding the dielectric particles).

In the resin composition according to the present invention, the dielectric particles are preferable to be a composite oxide having Perovskite structure.

The metal foil provided with a resin layer according to the present invention is the metal foil provided with a resin layer on at least one side of the metal foil, wherein the resin layer is formed by using the resin composition.

The resin layer of the metal foil provided with a resin layer according to the present invention is preferable to be used as a dielectric layer.

The metal clad laminate according to the present invention is characterized in including a resin layer formed by using the resin composition and a metal layer.

The printed wiring board according to the present invention is formed by using the metal foil provided with a resin layer or the metal clad laminate.

Advantages of the Invention

As the resin composition according to the present invention is low in both dielectric constant and dielectric tangent, a resin layer having excellent high frequency performance can be formed. In contrast, if the resin composition is made to include dielectric particles, a resin layer having high dielectric constant can be formed. So, employment of the resin composition according to the present invention enables formation of a resin layer excellent in electrical performance including high frequency performance required on a material used in manufacturing of a printed wiring board. Further, employment of the resin composition according to the present invention enables formation of a resin layer excellent in adhesion to the conductor layer and appropriate solubility with desmear solution. As a result, the metal foil provided with a resin layer formed by using the resin composition and the metal clad laminate including a rein layer can be preferably used as a material used in manufacturing of a multilayer printed wiring board.

PREFERRED EMBODIMENTS OF THE INVENTION

Embodiments of the resin composition, the metal foil provided with a resin layer, the metal clad laminate, and the printed wiring board according to the present invention will be described in this order.

<Resin Composition>

The resin composition according to the present invention will be described. The resin composition according to the present invention is the resin composition used for constituting a resin layer of a laminate provided with a resin layer on the metal layer surface, and includes a polyphenylene ether compound, a styrene-butadiene block copolymer, and a component promoting solubility with desmear solution in a prescribed contents ratio described later. The laminate will be first described, and then, each of the components for constituting the resin composition according to the present invention will be described.

1. Laminate

As described above, a laminate according to the present specification is a metal layer provided with a resin layer on a surface, and include a metal foil provided with a resin layer, metal clad laminate, and a printed wiring board in practice. Note that the laminate according to the present invention is not specifically limited as long as a resin layer is laminated on the surface of a metal layer (including a metal foil). That is, the laminate may be any type as long as being provided with a resin layer on the metal layer surface using the resin composition according to the present invention.

(1) Metal layer

The metal layer according to the present invention is the part of a metal foil in the metal foil provided with a resin layer, or the metal layer in the metal clad laminate or the printed wiring board described above. Any of the metal layers is used as a conductor layer in a printed wiring board, and may be a conductor pattern formed. The kind of metal constituting the metal layer is not specifically limited as long as conductive including various metals, copper, aluminum, nickel, cobalt, gold and platinum, or an alloy thereof. Although the metal constituting the metal layer may be any of these, copper, aluminum, nickel or an alloy thereof are preferable due to easy distribution in the market and inexpensive price. Furthermore, the metal layer is preferable to be composed of copper or copper alloy due to low electrical resistance and easy formation of a conductor pattern by etching.

(2) Resin Layer

The resin layer will be described. The resin layer is a layer provided on the metal layer surface. For example, the resin layer may be provided by coating a resin solution including the resin composition according to the present invention dissolved or dispersed in a solvent onto the metal layer surface, followed by drying and heating. The resin layer is used as an adhesive layer, an insulating layer and a dielectric layer in manufacturing of a printed wiring board.

2. Constituents of Resin Composition

The constituents of the resin composition will be described. The resin composition according to the present invention includes a polyphenylene ether compound, a styrene-butadiene block copolymer, and a component promoting solubility with desmear solution as essential constituents, and may include various additives including a curl lessen component and dielectric powder.

2-1. Essential Constituents (1) Polyphenylene Ether Compound

A polyphenylene ether compound as one of essential constituents of the resin composition according to the present invention will be described. The polyphenylene ether compound is a compound represented by the formulation (1) described later. The polyphenylene ether compound is a material having electrical performance low in both dielectric constant and dielectric tangent. If the polyphenylene ether compound is used as one of the constituents of the resin composition, a resin layer excellent in high frequency performance can be formed. Further, the polyphenylene ether compound is excellent in heat resistance because of an ether bond. Furthermore, low water absorption can be achieved because of no hydrophilic group in the compound. As a result, a resin layer hardly be degraded a quality under high-humidity environment can be formed.

The polyphenylene ether compound employed in the present invention is represented by the following general formula. In the following general formula, each of R1, R2, R3, and R4 represents a hydrogen atom or a hydrocarbon group having 1 to 3 carbon atoms.

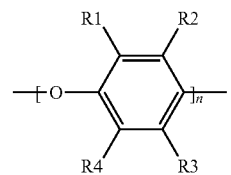

[Formula 1]

More specifically, the polyphenylene ether compounds including poly(2,6-dimethyl-1,4-phenylene) ether, poly(2,6-diethyl-1,4-phenylene) ether, poly(2,6-dipropyl-1,4-phenylene) ether may be used. Further, in the polyphenylene ether compound represented by the general formula, the terminal group is preferable to be a hydroxyl group. However, not only a polyphenylene ether compound having a hydroxy group as the terminal group but also a styrene-modified polyphenylene ether compound and a glycidyl-modified polyphenylene ether compound which are produced by modifying the terminal group by using a compound having a styrene group or a glycidyl group by a known method may be preferable to be used according to needs in the present invention. Alternatively, a commercially available product may be used.

The number average molecular weight of the polyphenylene ether compound is preferable to be 500 to 4,000, more preferable to be 1,000 to 3,000. A number average molecular weight of the polyphenylene ether compound of less than 500 is not preferable since the flexibility of the provided resin layer is made poor. In contrast, a number average molecular weight of the polyphenylene ether compound exceeding 4,000 is not preferable also since the solubility with a solvent including methyl ethyl ketone and toluene is made poor.

(2) Styrene-Butadiene Block Copolymer

The styrene-butadiene block copolymer will be described. The styrene-butadiene block copolymer is a component polymerizes (cross-linking) with a polyphenylene ether compound. The polymerization of a polyphenylene ether compound with a styrene-butadiene block copolymer makes the resin layer elastic and flexibility due to high bendability derived from the butadiene structure. The tendency is significant particularly if a styrene-modified polyphenylene ether compound or a glycidyl-modified polyphenylene ether compound is used. As a result, the adhesion between the resin layer and a metal layer (conductor layer) or an insulating resin substrate is improved and the crack resistance can be improved also. The peel strength of the wiring can qualify the value required for practical use if a printed wiring board is produced by using the metal foil provided with a resin layer. Further, if the styrene-butadiene block copolymer is used, the moisture absorption resistance performance is improved and the degradation in peel strength under high-moisture environment can be prevented. Furthermore, as the styrene-butadiene block copolymer has only a small number of polar groups, influence on the low dielectric performance of the polyphenylene ether compound is small. As a result, the electrical performance including excellent high frequency performance, low dielectric constant and low dielectric tangent derived from the polyphenylene ether compound can be maintained.

(3) Component Promoting Solubility with Desmear Solution

The component promoting solubility with desmear solution will be described. In the present invention, the component promoting solubility with desmear solution is a component used as a constituent of the resin composition, together with the polyphenylene ether compound and the styrene-butadiene block copolymer and provides solubility with desmear solution without spoiling the dielectric performance of the resin layer formed by using the resin composition. More specifically, the component promoting solubility with desmear solution is an easily oxidizable compound having a plurality of unsaturated bond easily oxidized by desmear solution, and cross-link with the polyphenylene ether compound and/or the styrene-butadiene block copolymer. In a current desmear treatment, permanganate salts including potassium permanganate and sodium permanganate are mainly included in the desmear solution. These permanganates function as an oxidizing agent to chemically dissolve and remove the resin. However, as the polyphenylene ether compound described above is excellent in acid resistance due to the molecular structure, the solubility with desmear solution is extremely low. Although the styrene-butadiene block copolymer has a double bond between carbons in the molecular chain, the double bond is consumed in the polymerization reaction with the polyphenylene ether compound. So, if the resin composition according to the present invention may include the component promoting solubility with desmear solution in a prescribed mixing ratio, the resin layer formed by using the resin composition can exhibit an appropriate solubility with desmear solution.

As the component promoting solubility with desmear solution, a compound having a plurality of unsaturated bond including a vinyl group is preferable to be used. Examples of the compound include diallyl phthalate, (meth)acrylate and unsaturated polyester. The resin composition according to the present invention is preferable to include one or two or more selected from these compounds as the component promoting solubility with desmear solution. The compounds will be described one by one.

Diallyl Phthalate:

In the present invention, diallyl phthalate may be any one among diallyl orthophthalate, diallyl isophthalate, and diallyl terephthalate; and the diallyl phthalate may be used alone or in combination of two or more. The diallyl phthalate may be a monomer or a polymer (oligomer or polymer); or may be a copolymer obtained by copolymerizing two or more monomers or polymers. Furthermore, the benzene ring of diallyl phthalate may be substituted with a halogen atom including chlorine atom, bromine atom and iodine atom. Alternatively, the whole or a part of the unsaturated bonds in the molecule of diallyl phthalate may be hydrogenated. Furthermore, the diallyl phthalate polymer may be a copolymer of any of these monomers and a different type of monomer including styrene (monomer) having a C=C double bond.

Among diallyl phthalates exemplified above, diallyl isophthalate is preferable to be used since heat resistance and mechanical strength are excellent, and is more preferable to use a polymer (oligomer having a molecular weight of about 10,000 to about 50,000) of diallyl isophthalate.

(meth)acrylate:

The (meth)acrylate will be described. In the present invention, the (meth)acrylate is a compound (acrylate and/or methacrylate) having an acrylic group or a methacrylic group (meth)acryl group) in the compound, and a multifunctional (meth)acrylate having a plurality of (meth)acryl groups in the compound is preferable. More specifically, di(meth)acrylate and poly(meth)acrylate having 3 or more (meth)acryl groups in the compound are preferable to be used. Alternatively, modified polyol poly(meth)acrylate may be used.

Examples of the di(meth)acrylate include ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, 1,4-butanediol di(meth)acrylate, 1,3-butanediol di(meth)acrylate, neopentyl glycol di(meth)acrylate, 1,6-hexanediol di(meth)acrylate, tricyclodecanedimethanol di(meth)acrylate and bis-glycidyl (meth)acrylate.

Examples of the poly(meth)acrylate include trimethylolpropane tri(meth)acrylate, pentaerythritol tri(meth)acrylate and dipentaerythritol hexa(meth)acrylate.

Furthermore, examples of the modified polyol polyacrylates include bisphenol S modified with 4-mol ethylene oxide diacrylate, bisphenol A modified with 4-mol ethylene oxide diacrylate (modified bisphenol A diacrylate), fatty acid-modified pentaerythritol diacrylate, trimethylolpropane modified with 3-mol propylene oxide triacrylate and trimethylolpropane modified with 6-mol propylene oxide triacrylate.

Among the (meth)acrylates exemplified above, a bifunctional (meth)acrylate is preferable to be used as described above because of low viscosity against the molecular weight. Low molecular weight of the (meth)acrylate included in the resin composition is not preferable since the compound tends to volatilize together with a solvent in the process for formation of the resin layer. In contrast, if the compound has a large molecular weight, the viscosity of the resin solution increases to result poor handling performance in kneading with dielectric particles described later. Among the bifunctional (meth)acrylates, ethylene glycol di(meth)acrylate, tetraethylene glycol di(meth)acrylate, tricyclodecane dimethanol di(meth)acrylate and modified bisphenol A diacrylate are particularly preferable to be used.

Unsaturated Polyester:

The unsaturated polyester will be described. The unsaturated polyester resin is a polymer having a double bond between carbons and an ester bond in the main chain. The unsaturated polyester can be produced by a dehydration condensation reaction between an acid component including an unsaturated dibasic acid and a polyalcohol component under presence of an esterification catalyst.

Examples of the unsaturated dibasic acid as an essential component of the acid components include maleic acid, fumaric acid, itaconic acid, citraconic acid and anhydrides thereof and are used alone or in combination of two or more. Examples of the acid component used according to needs in combination with the unsaturated dibasic acid include a fatty acid including phthalic acid, phthalic anhydride, isophthalic acid, terephthalic acid, tetrahydrophthalic acid, tetrahydrophthalic anhydride, hexahydrophthalic acid, hexahydrophthalic anhydride and adipic acid; and a mixture of a plurality of fatty acids including soybean oil fatty acid, linseed oil fatty acid, palm oil fatty acid, tall oil fatty acid and rice bran oil fatty acid. These may be used alone or in combination of two or more.

Examples of the polyalcohol component include a dihydric alcohol including ethylene glycol, propylene glycol, neopentyl glycol, 1,4-butanediol, 1,6-hexanediol, 1,6-cyclohexane dimethanol, glycerol monoallyl ether, trimethylol propane monoallyl ether and pentaerythritol diallyl ether; and tri- or more hydric alcohol include glycerol, trimethylol propane, tris-2-hydroxyethyl isocyanurate and pentaerythritol monoallyl ether. These may be used alone or in combination of two or more.

Examples of the esterification catalyst used in the dehydration condensation reaction include a phosphorus-containing compound including triphenylphosphine and tributylphosphine; a tertiary amine including N,N-benzyldimethylamine, N,N-dimethylphenyl amine and triethylamine; a quaternary compound including quaternary ammonium salt, quaternary phosphonium salt and quaternary pyridinium salt; a chloride including zinc chloride, aluminum chloride and tin chloride; and an organic metal compound including tetrabutyl titanate.

(4) Contents Ratio

The contents ratio among the polyphenylene ether compound, the styrene-butadiene block copolymer and the component promoting solubility with desmear solution in the resin composition according to the present invention will be described. The resin composition according to the present invention is characterized in including 10 parts by mass to 100 parts of a styrene-butadiene block copolymer and 0.1 parts by mass to 100 parts by mass of a component promoting solubility with desmear solution against 100 parts by mass of polyphenylene ether compound.

A styrene-butadiene block copolymer content of less than 10 parts by mass against 100 parts by mass of a polyphenylene ether compound is not preferable since film formation is made difficult and the resin layer formed by using the resin composition is insufficient in elasticity and flexibility. In contrast, a styrene-butadiene block copolymer content of more than 100 parts by mass against 100 parts by mass of a polyphenylene ether compound is not preferable since the resin layer formed by using the resin composition is poor in heat resistance and the glass transition temperature (Tg) at a required level cannot be achieved.

The contents ratio of a styrene-butadiene block copolymer against 100 parts by mass of a polyphenylene ether compound is more preferable to be 20 parts by mass or more, and furthermore preferable to be 40 parts by mass or more. If a contents ratio of styrene-butadiene block copolymer is 20 parts by mass or more, preferably 40 parts by mass or more against 100 parts by mass of a polyphenylene ether compound, film formation is made easy and the resin layer formed by using the resin composition is excellent in elasticity and flexibility.

A component promoting solubility with desmear solution content of less than 0.1 parts by mass against 100 parts by mass of a polyphenylene ether compound is not preferable since the resin layer formed by using the resin composition has low solubility with the desmear solution, and the object of the present invention cannot be achieved. In contrast, a component promoting solubility with desmear solution content of more than 100 parts by mass against 100 parts by mass of a polyphenylene ether compound is not preferable since solubility with the desmear solution may be excessive. Further, this content is not preferable since a concern that the dielectric performance of the polyphenylene ether compound is made poor arises. As described above, in the resin composition according to the present invention, content of the component promoting solubility with desmear solution is preferable to be 10 parts by mass to 80 parts by mass against 100 parts by mass of a polyphenylene ether compound.

2-2. Additives

Additives will be described. The additives described below may be appropriately included in the resin composition depending on requirements including the mechanical performance and the electrical performance on the resin layer.

(1) Curl Lessen Component

Curl lessen components will be described. The resin composition according to the present invention is preferable to include 0.1 parts by mass to 30 parts by mass, more preferably be 10 parts by mass or more, of a curl lessen component against 100 parts by mass of the polyphenylene ether compound. In formation of a resin layer by using the resin composition, a resin solution including the resin composition is coated on the surface of a metal layer, and the coated film is dried and heated as described above. In the process, solvent volatilizes from the coated film, and the constituents of the resin composition polymerizes each other to result a polymer having a cross-linked structure. In other words, a resin layer is made to be a semi-cured state or a full-cured state. As the resin layer is made easy to shrink than the coated film, curling of the metal layer, i.e. warpage with outside the metal layer and inside the resin layer tends to occur. The resin composition is made to include a curl lessen component in the range described above to lessen the curling in the resin layer semi-cured or full-cured in the present invention.

As the curl lessen component, a relatively low molecular weight compound in liquid form at room temperature, and having reactivity with a polyphenylene ether compound, is preferable to be used. More specifically, styrene monomer, α-methyl styrene and α-methyl styrene dimer (2,4-diphenyl-4-methyl-1-pentene) may be used. Further, lauryl mercaptan, octyl mercaptan, 2-mercaptoethanol, octyl thioglycolate and 3-mercaptopropionic acid may be used. If these compounds in the content described above is appropriately included in the resin composition according to the present invention, appropriate control of the cross-linking reaction in polymerization among each of the constituents in the resin composition can be achieved. As a result, the shrinkage of the semi-cured or full-cured resin layer is reduced to lessen the curling.

(2) Dielectric Particles

If a resin layer having high dielectric constant should be formed, e.g. formation of the dielectric layer of a capacitor, 50 parts by mass to 600 parts by mass of dielectric particles may be contained against 100 parts by mass of the resin composition excluding the dielectric particles. As the dielectric particles included in the resin composition makes formed resin layer a high dielectric constant, a capacitor circuit having a large capacitance can be formed.

Capacitance of a capacitor is determined from the expression described below. The capacitance (C) of a capacitor increases in proportion to the dielectric constant ($\epsilon$) of a dielectric layer and the electrode area (A), and in reverse proportion to the distance (d) between electrodes. In the expression, $\epsilon$(: epsilon)$_0$ represents relative permittivity.

$$C = \epsilon \cdot \epsilon_0 (A/d)$$

Content of dielectric particles of less than 50 parts by mass against 100 parts by mass of the resin composition is not preferable since the resin layer cannot achieve a sufficiently high dielectric constant and a capacitor circuit formed by using the laminate fails to achieve the level of capacitance required in the market. So, 200 parts by mass or more content of dielectric particles against 100 parts by mass of the resin composition are more preferable. As higher the content of dielectric particles in the resin composition, higher the dielectric constant of the resin layer formed, increased content makes a capacitor circuit formed higher in capacitance.

In contrast, content of dielectric particles exceeding 600 parts by mass against 100 parts by mass of the resin composition is not preferable since the amount of resin existing in the resin layer decreases to result poor adhesion between the resin layer and a metal layer. Further, adhesion between the laminate and the other layer in a multilayer printed wiring board including an inner layer material might be made poor. Furthermore, decreased amount of resin is not preferable since which makes the resin layer fragile due to the poor toughness after curing the resin. As described above, content of the dielectric particles is more preferable to be 600 parts by mass or less against 100 parts by mass of the resin composition.

The dielectric particles are preferable to be composed of metal oxide including at least one metal selected from magnesium, silicon, aluminum, titanium, zinc, calcium, strontium, zirconium, barium, tin, neodymium, bismuth, lithium, samarium and tantalum. Specifically, the dielectric particles are preferable to be composed of a composite oxide having Perovskite structure, i.e. a ferroelectric material, to provide a resin layer having a higher dielectric constant. Examples of the composite oxide having Perovskite structure include barium titanate, strontium titanate, barium strontium titanate, strontium zirconate, bismuth zirconate, PLZT ($PbLATiO_3 \cdot PbLaZrO$) and SBT ($SrBi_2Ta_2O_9$).

A primary particle size of the dielectric particles is preferable to be in the range of 0.02 micron-meters to 2 micron-meters. If the resin composition is dispersed or dissolved in a solvent for preparation of a resin solution, a primary particle size of the dielectric particles of less than 0.02 micron-meters is not preferable since uniform dispersion in the resin solution is made difficult.

Note that the capacitance of a capacitor increases in reverse proportion to the distance between electrodes. So, capacitance of a capacitor is made higher as thinner the thickness of the resin layer. A primary particle size of the dielectric particles exceeding 2 micron-meters is not preferable since formation of the resin layer having a thickness of about 3 micron-meters to 4 micron-meters is made difficult due to the large particle size of the dielectric particles, and the surface of the semi-cured resin layer tends to be rough.

The dielectric particles are preferable to be surface treated to improve the dispersibility in the resin solution. More specifically, treatments including a silane coupling agent treatment, an oleic acid treatment and a stearic acid treatment are preferable. In view of good wettability with a solvent used in preparation of the resin solution, the dielectric particles are preferable to be carried out a silane coupling agent treatment.

(3) Others

The resin composition according to the present invention may include other additives including an epoxy resin, a curing agent, a curing accelerator, thermoplastic particles, a colorant, an antioxidant, a flame retardant, a coupling agent, a polymerization initiator, a dispersing agent and an inorganic filler. An appropriate amount of the various additives may be included without departing from the scope of the present invention.

(Metal Foil Provided with a Resin Layer)

The metal foil provided with a resin layer according to the present invention will be described. The metal foil provided with a resin layer according to the present invention is provided a resin layer on at least one side of the metal foil and the resin layer is formed by using the resin composition according to the present invention described above.

1. Metal Foil

The metal foil used in the present invention may be any one of an electro-deposited foil and a rolled foil. The method for manufacturing the metal foil is not specifically limited. Since the type of metal constituting the metal foil is not limited also as with the metal layer constituting the laminate described above, the description is omitted. Note that the metal for constituting the metal foil is preferable to be copper or copper alloy, and the metal foil is preferable to be a copper foil or a copper alloy foil for the same reason described above.

Although the thickness of the metal foil is not specifically limited in the present invention, the resin layer is preferable to be provided on a metal foil having a thickness in the range of 0.5 micron-meters to 70 micron-meters. A metal foil having a suitable thickness may be appropriately used depending on the properties required in manufacturing of a printed wiring board. If a metal foil having a thickness of 5.0 micron-meters or less is provided with a resin layer on a single side (one surface side), the other side of the metal foil may be provided with a so-called carrier foil (support). By using a metal foil having a thickness of 5.0 micron-meters or less, a high-definition wiring having a narrower wiring pitch can be formed with a good etching factor.

The resin layer should be provided on at least one side of the metal foil, and the resin layer provide on both sides of the metal foil is acceptable in the present invention. If the resin layer is provided on just one side of an electro-deposited metal foil, the resin layer may be provided on any side among the shiny side (drum side) and the deposit side (matte side). The surface of a metal foil provided with the resin layer may be with/without roughening treatment. In any case, the surface roughness (Rzjis) of the metal foil (i.e.

the surface provided with a resin layer, and the same shall apply hereinafter) is preferable to be 3 micron-meters or less.

The roughening treated surface of a metal foil is preferable since the adhesion between the resin layer and the metal foil is enhanced. In contrast, the surface of a metal foil without roughening treatment is preferable since a conductor pattern having a good etching factor can be formed. If the surface of a metal foil is not roughening treated, the signal delay in high-frequency signals due to the so-called skin effect can be reduced.

In the present invention, the surface of a metal foil may be rust-proofing treated and the resin layer is provided on the rust-proofing treatment layer surface. Examples of the rust-proofing treatment on a metal foil include inorganic rust-proofing treatment using zinc, nickel, cobalt and so on and chromate treatment using a chromate; and organic rust-proofing treatment using organic agent including benzotriazole and imidazole. Hereinafter the term "metal foil" may include a metal foil provided with a rust-proofing treatment layer on the metal foil surface, and the term "metal foil surface" may include the surface of a rust-proofing treatment layer.

In the present invention, a silane coupling agent treatment may be applied on one side surface of a metal foil and the surface of silane coupling agent layer is provided with a resin layer. If the metal foil surface is provided with a resin layer through a silane coupling agent layer, adhesion between the metal foil and the resin layer can be further enhanced since the wettability of the metal foil surface to the resin layer is improved. In silane coupling agent treatment, various silane coupling agents including an amino-functional silane coupling agent, an acrylic-functional silane coupling agent, a methacrylate-functional silane coupling agent, a vinyl-functional silane coupling agent, an epoxy-functional silane coupling agent, an olefin-functional silane coupling agent and mercapto-functional silane coupling agent may be used. More specifically, vinyl trimethoxysilane, vinylphenyl trimethoxysilane, γ-methacryloxypropyl trimethoxysilane, γ-glycidoxypropyl trimethoxysilane, 4-glycidylbutyl trimethoxysilane, γ-aminopropyl trimethoxysilane, N-β(aminoethyl)γ-aminopropyl trimethoxysilane, N-3-(4-(3-aminopropoxyl)butoxy)propyl-3-aminopropyl trimethoxysilane, imidazole silane, triazine silane, γ-mercaptopropyl trimethoxysilane, 3-acryloxypropyl trimethoxysilane may be used as the silane coupling agent.

If a silane coupling agent treatment is carried out on a metal foil surface, a treatment solution including silane coupling agent in concentration of 0.5 g/l to 10 g/l in water as a solvent is made uniformly contact to the metal foil surface at room temperature by a method including an immersion method, a showering method and a spraying method to make the silane coupling agent uniformly adsorbed on the metal foil surface. The silane coupling agent forms a coated film by condensation bonding with OH groups exposing on the metal foil surface. Concentration of a silane coupling agent of less than 0.5 g/l is not preferable since adsorption rate of the silane coupling agent on the metal foil surface is too slow and results poor economic feasibility as a general commercial production. In addition, as adsorption of the silane coupling agent on the metal foil surface is not uniform, it is not preferable. In contrast, concentration of a silane coupling agent exceeding 10 g/l is not preferable from an economic view point since the adsorption rate or uniformity of adsorption are not further improved.

Hereinafter the term "metal foil" may include a metal foil provided with a silane coupling agent layer on the metal foil surface, and the term "metal foil surface" may include the silane coupling agent layer surface.

2. Resin layer

In the metal foil provided with a resin layer according to the present invention, the resin layer is formed by using the resin composition according to the present invention described above. Since the resin composition is the same as above, the description on the resin composition is omitted. The resin layer is a layer used as an adhesive layer, an insulating layer, a dielectric layer in manufacturing of a printed wiring board, the same as the resin layer in a laminate. The surface of the resin layer may be further provided with a metal foil and may be used as a material for forming a capacitor circuit described later. Alternatively the resin layers of metal foils with a resin layer may be laminated to each other and may be used as a material for forming a capacitor circuit described later.

The thickness of the resin layer can be appropriately adjusted without any specific limitation depending on the application of the resin layer. The general metal foil provided with a resin layer is provided with a resin layer having a thickness of about 0.5 micron-meters to 100 micron-meters. If the metal foil provided with a resin layer is used as a dielectric layer of a capacitor, preferable thickness is 50 micron-meters or less. Thinner resin layer has advantage to provide a large capacitance in a capacitor. So, if the resin layer is used as the dielectric layer of a capacitor, more preferable thickness of the resin layer is 25 micron-meters or less.

3. Manufacturing method of metal foil provided with resin layer

An example of the manufacturing method of a metal foil provided with a resin layer according to the present invention will be described. The manufacturing process of the metal foil provided with a resin layer may be roughly divided into the steps of: (1) step for preparation of a resin solution; (2) step for coating the resin solution; and (3) the drying step, for example. Each of the steps will be described.

(1) Step for Preparation of a Resin Solution

The step for preparation of a resin solution is the step for preparation of a resin solution (varnish) including a polyphenylene ether compound, 10 parts by mass to 100 parts by mass of a styrene-butadiene block copolymer and 0.1 parts by mass to 100 parts by mass of a component promoting solubility with desmear solution against 100 parts by mass of the polyphenylene ether compound. In preparation of the resin solution, a polyphenylene ether compound, a styrene-butadiene block copolymer and a component promoting solubility with desmear solution may be mixed at a prescribed contents ratio to make a resin composition in advance and then the mixture is dissolved in a solvent. Alternatively, a polyphenylene ether compound, a styrene-butadiene block copolymer, and a component promoting solubility with desmear solution may be dissolved in a solvent independently and the solutions are then mixed to finish prescribed contents ratio. In other words, the method for preparation of a resin solution is not specifically limited.

As solvent used for preparation of the resin solution, a ketone-type solvent including methyl ethyl ketone, or an aromatic-type solvent including toluene may be used. If any of the solvents is used, the resin composition can be easily dissolved, and the viscosity of the resin solution can be easily adjusted. Furthermore, any of the solvents can be efficiently volatilized when the metal foil is provided with a resin solution followed by semi-curing, cleanup of the volatilized gas is easy.

In the step for preparation of a resin solution, the resin solid content is preferable to be appropriately adjusted to make viscosity of the resin solution suitable for accurate formation of a coated film for preferable thickness of resin layer in coating of the resin solution on the metal layer surface.

(2) Step for Coating of a Resin Solution

The Step for coating of a resin solution is the step for coating of the resin solution on one side of the metal foil to make the thickness of the resin layer after drying 0.5 micron-meters to 100 micron-meters. The method for coating the resin solution is not specifically limited and a suitable method may be appropriately employed depending on the thickness of the resin layer to be formed.

(3) Drying Step

Drying may be appropriately carried out by a conventional known method without any specific limitation. In the step for dying, the solvent is volatilized from the coated film, and finish the curing reaction of a resin composition at an intermediate stage to provide a semi-cured resin. Through the steps described above, the metal foil provided with a resin layer according to the present invention can be manufactured.

(Metal Clad Laminate)

Embodiments of the metal clad laminate according to the present invention will be described. The metal clad laminate according to the present invention is characterized in using the metal foil provided with a resin layer according to the present invention described above. Since the metal clad laminate has various types, each type will be briefly demonstrated.

Example of the first type metal clad laminate may be a double-side metal clad laminate in which the resin layer of the metal foil provided with a resin layer according to the present invention is laminated to a metal foil. The double-side metal clad laminate is manufactured by using the metal foil provided with resin layer and hot press the metal foil provided with the semi-cured resin layer with a metal foil. In other words, after finishing the drying step (3) in the manufacturing method of the metal foil provided with resin layer, if the metal foil is put on the resin layer and hot pressed, the double-side metal clad laminate having excellent adhesion between the resin layer surface and the metal foil can be obtained through the process the resin layer melts and cures.

Examples of the second type metal clad laminate include a double-side metal clad laminate which can be obtained by hot pressing after contacting surfaces of a resin layers of the metal foils provided with resin layer with each other.

The double-side metal clad laminates in the first type and in the second type are preferable to be used as a material for forming an embedded capacitor circuit in a multilayer printed wiring board. If the double-side metal clad laminate is used as a material for forming an embedded capacitor circuit, a capacitor circuit can be easily formed and measurement of withstand voltage performed before lamination of the double-side metal clad laminate to the inner layer material of a multilayer printed wiring board results an improved production yield since a dielectric layer is sandwiched between metal foils to be used as electrode layers.

Examples in a third type include a single-side metal clad laminate or a double-side metal clad laminate manufactured by hot pressing the single or double resin layer(s) of the metal foil(s) provided with a resin layer according to the present invention on an one surface or both surfaces of a required number of resin substrates, such as a pre-preg sheets made of paper or glass cloth impregnated with insulating resin and paper phenolic resin substrate. Note that the resin layer of the metal foil provided with a resin layer according to the present invention functions as an adhesive layer.

Further, examples of a fourth type include a laminate manufactured by laminating the resin layer of the metal foil provided with a resin layer according to the present invention with the inner layer board of a multilayer printed wiring board (inner wiring) layer) by hot pressing to make the resin layer an interlayer insulating layer. Note that the resin layer of the metal foil provided with a resin layer according to the present invention functions as an adhesive layer also.

Further, examples of a fifth type include a laminate manufactured by laminating the resin layer of the metal foil provided with a resin layer according to the present invention with the inner layer board of a multilayer printed wiring board (inner wiring layer) by hot pressing. Note that the resin layer of the metal foil provided with a resin layer according to the present invention functions as an interlayer insulating layer. The metal clad laminates according to the present invention is not limited to these types, but include various type of laminates.

<Printed Wiring Board>

The printed wiring board according to the present invention is characterized in that the metal foil provided with a resin layer according to the present invention is used as described above, and may be manufactured by using the metal clad laminate described above. Further, the printed wiring board according to the present invention may be a multilayer printed wiring board, or may be a multilayer build-up printed wiring board provided a build-up layer using the metal foil provided with a resin layer.

As the embodiments of the metal foil provided with a resin layer, the metal clad laminate, and the printed wiring board according to the present invention described above are a parts of types according to the present invention, these may be appropriately modified without departing from the scope to the present invention. Although the present invention will be demonstrated more specifically with reference to following examples, the present invention is not limited to the following examples. In the following examples, the metal foil provided with a resin layer formed by using the resin composition according to the present invention will be described.

EXAMPLES

Example 1

Manufacturing of Metal Foil Provided with a Resin Layer

In Example 1, a copper foil provided with a resin layer was manufactured in the following manner. First, 200 grams of polyphenylene ether resin (MX-90 manufactured by SABIC Japan) and 400 grams of toluene put into 1-liter capacity four-neck flask equipped with a stirrer, a temperature controller and a reflux tube were stirred to dissolve at 60° C. Then, 10 grams of chloromethyl styrene was put into the flask with stirring for dissolving, and the solution temperature was elevated to 80° C. Further, 24 grams of 50 mass % sodium hydroxide aqueous solution was dropped into the mixture while stirring continue for 3 hours at 80° C. Then, the content was neutralized with 1 N aqueous hydrochloric acid followed by adding methanol to the mixture for precipitation of a compound and filtration. After the filtrate was rinsed twice with methanol aqueous solution (methanol: distilled water=4:1), the solvent and water contained were dried to finish a polyphenylene ether compound.

The polyphenylene ether compound obtained as above was then dissolved in toluene to prepare a 50 mass % polyphenylene ether compound solution. Further, a styrene-butadiene block copolymer (TR2003 manufactured by JSR Corporation) was dissolved in toluene to prepare a 30 mass % styrene-butadiene block copolymer solution. Further, as the component promoting solubility with desmear solution, a diallyl isophthalate oligomer (DAISO ISO DAP (registered trade mark) manufactured by Daiso Co., Ltd.) was dissolved in toluene to prepare a 30 mass % diallyl isophthalate oligomer solution. Then, respective solutions were mixed with each other to make a mass ratio among the polyphenylene ether compound, the styrene-butadiene block copolymer, the diallyl isophthalate oligomer, and 2,4-diphenyl-4-methyl-1-pentene (Curling Lessen Component: alpha-methyl styrene dimer manufactured by Wako Pure Chemical Industries, Ltd.) 50:30:10:10, and a resin solution (varnish) having a resin solid content of 40% was prepared.

Into the resin solution prepared as described above, 233 parts by mass of barium titanate powder against 100 parts by mass of the whole amount of the resin composition in the resin solution was added and dispersed to obtain a resin solution applicable for formation of a resin layer (dielectric layer) in a semi-cured state including 70 mass % barium titanate powder. The barium titanate powder used has an average primary particle size of 0.25 micron-meters and a cumulative volume average particle size ($D_{50}$) of 0.5 micron-meters.

Then the resin solution was coated on the surface of a low-profile copper foil having a thickness of 35 micron-meters and a surface roughness (Rzjis) of 2.2 micron-meters by using a gravure coater to make thickness of the resin layer after drying 12 micron-meters. The obtained coated film was dried at 150° C. for 3 minutes to finish a copper foil provided with resin layer semi-cured the resin composition.

<Manufacturing of Double-Side Metal Clad Laminate>

The resin layers of the prepared two sheets of copper foils provided with resin layer faced with each other were laminated under hot pressing at 220° C. for 90 minutes and 30 kgf/cm$^2$ to prepare a double-side metal clad laminate (double-side copper clad laminate).

Example 2

A copper foil provided with resin layer and a double-side metal clad laminate were prepared in the same manner as in Example 1 except that respective solutions were mixed with each other to make a mass ratio among the polyphenylene ether compound, the styrene-butadiene block copolymer, the diallyl isophthalate oligomer, and 2,4-diphenyl-4-methyl-1-pentene in the resin solution 40:20:30:10.

Example 3

A copper foil provided with resin layer and a double-side metal clad laminate were prepared in the same manner as in Example 1 except that the diallyl isophthalate oligomer as a component promoting solubility with desmear solution was replaced by a diallyl phthalate oligomer (DAISO DAP (registered trade mark) manufactured by Daiso Co., Ltd.).

Example 4

A copper foil provided with resin layer and a double-side metal clad laminate were prepared in the same manner as in Example 1 except that the diallyl isophthalate oligomer as component promoting solubility with desmear solution was replaced by a tetraethylene glycol dimethacrylate (4G (polyethylene glycol dimethacrylate) manufactured by Shin-Nakamura Chemical Co., Ltd.).

Example 5

A copper foil provided with resin layer and a double-side metal clad laminate were prepared in the same manner as in Example 1 except that the diallyl isophthalate oligomer as component promoting solubility with desmear solution was replaced by an unsaturated polyester resin (U-PICA 8523 manufactured by Japan U-PICA Co., Ltd.).

COMPARATIVE EXAMPLE

Comparative Examples will be described.

Comparative Example 1

A copper foil provided with resin layer and a double-side metal clad laminate were prepared in the same manner as in Example 1 except excluding a component promoting solubility with desmear solution and the other respective solutions were mixed with each other to make a mass ratio among the polyphenylene ether compound, the styrene-butadiene block copolymer and 2,4-diphenyl-4-methyl-1-pentene in the resin solution 55:35:10.

Comparative Example 2

A copper foil provided with resin layer and a double-side metal clad laminate were manufactured in the same manner as in Example 1 except that respective solutions were mixed with each other to make a mass ratio among the polyphenylene ether compound, the styrene-butadiene block copolymer, the diallyl isophthalate oligomer and 2,4-diphenyl-4-methyl-1-pentene in the resin solution 30:20:40:10.

Comparative Example 3

A copper foil provided with resin layer and a double-side metal clad laminate were prepared in the same manner as in Example 1 except that a bisphenol F-type epoxy resin (YDF-170 manufactured by Nippon Steel Chemical Co., Ltd.) which is used as a curing agent (cross-linking agent) for the polyphenylene ether compound was used instead of the component promoting solubility with desmear solution.

Examination

On the double-side metal clad laminates prepared in Examples 1 to 5 and Comparative Examples 1 to 3, (1) dielectric performance of the resin layer; and (2) solubility with a desmear solution were examined. The examination method and the examination results will be separately described later.

1. Examination Method (1) Examination on the Dielectric Performance of Resin Layer Examination on the dielectric performance of a resin layer was carried out as follows. The copper foils on both sides of the double-side metal clad laminates prepared in Examples 1 to 5 and Comparative Examples 1 to 3 were removed by etching to prepare specimens for measurement of dielectric tangent. The dielectric tangents at 10 GHz of the specimens were measured by a network analyzer E8362B manufactured by Agilent Technologies. Results are shown in Table 1.

(2) Examination on the Solubility with Desmear Solution

Examination on the solubility with desmear solution was carried out as following. A laminate removed the copper foils on both sides of the double-side metal clad laminate manufactured in Examples 1 to 5 and Comparative Examples 1 to 3 by etching were prepared as specimens for examination of the solubility with desmear solution the same as the specimens for measurement of dielectric tangent. By using three specimens in respective examinations of the solubility with desmear solution, the weight of the respective specimen for examination of the solubility with desmear solution prepared was measured first. The specimens were then immersed into a swelling solution (manufactured by Rohm and Haas Electronic Materials K.K.) at 75° C. for 10 minutes followed by immersing into a potassium permanganate solution (manufactured by Rohm and Haas Electronic Materials K.K.) at 70° C. for 10 minutes. Then the specimens were immersed in a neutralizing solution (manufactured by Rohm and Haas Electronic Materials K.K.) at 40° C. for 3 minutes followed by rinsing with water. After the specimens were dried in the atmosphere, weight were measured. Based on the weight before and after immersion in the desmear solution (potassium permanganate solution) for 10 minutes, the amount dissolved in the desmear solution were determined. The dissolved amount was determined into the dissolution rate in desmear solution per minute. The results are shown in Table 1.

2. Examination Results (1) Dielectric Performance of Resin Layer

According to Table 1, a dielectric tangent of the specimen in Comparative Example 3 is 0.0084, while a dielectric tangent of all the other specimens are 0.005 or less, i.e. dielectric tangent of the specimen in Comparative Example 3 is higher than that of the other specimens. The resin layer in Comparative Example 3 was prepared in the same manner as in Example 1 except for including a bisphenol F-type epoxy resin as cross-linking agent instead of the component promoting solubility with desmear solution. In contrast, a dielectric tangent of the resin layer in Comparative Example 1 formed of a resin solution excluding both component promoting solubility with desmear solution and bisphenol F-type epoxy resin is the lowest 0.0020. As is made apparent from the above, dielectric tangent of the resin layer formed of a resin solution excluding component promoting solubility with desmear solution is the lowest and high frequency performance is good. Further, it was confirmed that even the dielectric tangent of the resin layer formed by using the resin composition according to the present invention including the component promoting solubility with desmear solution in Examples are slightly higher than that in Comparative Example 1, but the resin layer is good in high frequency performance. In particular, as is apparent in Example 1 using diallyl isophthalate oligomer as component promoting solubility with desmear solution, the dielectric tangent equivalent to that of the resin layer in Comparative Example 1 excluding component promoting solubility with desmear solution can be achieved. In contrast, as is apparent in Comparative Example 3, the matter is confirmed that dielectric tangent increases and results poor high frequency performance if bisphenol F-type epoxy resin is included instead of the component promoting solubility with desmear solution. Note that the dielectric tangent tends to increase as the content of diallyl isophthalate oligomer in the resin composition increases as shown in Example 2 and Comparative Example 2.

(2) Performance of Solubility with Desmear Solution

According to Table 1, it was confirmed that a dissolution rate in desmear solution of the specimens in Comparative Example 1 excluding component promoting solubility with desmear solution is 0.00 mg/min, i.e. almost no solubility with desmear solution. So, if a resin layer is formed of a resin composition mainly composed of a polyphenylene ether compound and a styrene-butadiene block copolymer as in Comparative Example 1 and the resin layer is employed as a material used in manufacturing a multilayer printed wiring board having interlayer connections with "Through Holes", smears may remain inside the "Through Holes" to possibly cause defective interlayer connections since the solubility with desmear solution is very low.

In contrast, as a dissolution rate in desmear solution of the specimens in Examples 1 to 5 are 0.10 mg/min to 0.20 mgs/min, these specimens are confirmed to have an appropriate solubility with desmear solution. The matter is confirmed that application of the component promoting solubility with desmear solution according to the present invention together with the polyphenylene ether compound and the styrene-butadiene block copolymer can make the resin layer formed by using the resin composition soluble in desmear solution.

Note that the dissolution rate in desmear solution tends to high as the content of component promoting solubility with desmear solution in the resin composition increases as shown in Example 2 and Comparative Example 2. If the resin composition includes a bisphenol F-type epoxy resin instead of the component promoting solubility with desmear solution as in Comparative Example 3, solubility with desmear solution is extremely high. The high solubility in desmear solution exceeding a certain limit as in Comparative Examples 2 and 3 is not preferable since sink of the resin due to the excess dissolution progress of resin layer around "Through Holes" may generate in desmear treatment and adhesion between the resin layer and the conductor layer may be made poor locally.

The dielectric constants of the resin layer measured by a network analyzer E8362B manufactured by Agilent Technologies in the copper foil provided with resin layer prepared in Example 1 show relatively high values of 7.3/7.3/7.1 (1 GHz/3 GHz/10 GHz). In contrast, the dielectric constants of the resin layer measured on a copper foil provided with resin layer prepared in the same manner as in Example 1 except for excluding barium titanate powder are relatively low value of 2.5/2.5/2.5 (1 GHz/3 GHz/10 GHz). So, the matter is confirmed that as the resin composition according to the present invention is low in both dielectric constant and dielectric tangent, application of the resin composition according to the present invention enables formation of a resin layer excellent in high frequency performance. Further, the matter is also confirmed that the resin composition including dielectric particles enables formation of resin layer having a high dielectric constant. So, application of the resin composition according to the present invention enables formation of a resin layer having preferable electric performance required on a material used in manufacturing of a printed wiring board.

TABLE 1

|  |  | Example 1 | Example 2 | Example 3 | Example 4 | Example 5 | Comparative Example 1 | Comparative Example 2 | Comparative Example 3 |
|---|---|---|---|---|---|---|---|---|---|
| Resin composition | Polyphenylene ether compound | 50 | 40 | 50 | 50 | 50 | 55 | 30 | 50 |
|  | Styrene-butadiene copolymer | 30 | 20 | 30 | 30 | 30 | 35 | 20 | 30 |
|  | Diallyl isophthalate oligomer | 10 | 30 | — | — | — | — | 40 | — |
|  | Diallyl phthalate oligomer | — | — | 10 | — | — | — | — | — |
|  | Tetraethylene glycol dimethacrylate | — | — | — | 10 | — | — | — | — |
|  | Unsaturated polyester resin | — | — | — | — | 10 | — | — | — |
|  | Bisphenol F-type epoxy resin | — | — | — | — | — | — | — | 10 |
|  | 2,4-Diphenyl-4-methyl-1-pentene | 10 | 10 | 10 | 10 | 10 | 10 | 10 | 10 |
|  | Barium titanate powder | 233 | 233 | 233 | 233 | 233 | 233 | 233 | 233 |
| Examination | Dielectric tangent Df (at 10 GHz) | 0.0022 | 0.0040 | 0.0030 | 0.0047 | 0.0026 | 0.0020 | 0.0041 | 0.0084 |
|  | Dissolution rate in desmear solution [mgs/min] | 0.12 | 0.17 | 0.10 | 0.20 | 0.20 | 0.00 | 0.28 | 0.43 |

INDUSTRIAL APPLICABILITY

Application of a resin composition including 10 parts by mass to 100 parts by mass of a styrene-butadiene block copolymer and 0.1 parts by mass to 100 parts by mass of a component promoting solubility with desmear solution against 100 parts by mass of a polyphenylene ether compound according to the present invention enables formation of a resin layer having excellent electrical performance including high frequency performance and so on and appropriate solubility with desmear solution required on a material used in manufacturing of a printed wiring board.

The invention claimed is:

1. A resin composition used for constituting a resin layer of a laminate in which the resin layer is provided on a metal layer surface, the resin composition comprising
   a styrene-modified polyphenylene ether compound obtained from reacting a polyphenylene ether compound with chloromethyl styrene;
   10 parts by mass to 100 parts by mass of a styrene-butadiene block copolymer;
   0.1 parts by mass to 100 parts by mass of a component promoting solubility of the resin composition with a desmear solution, wherein the component is a polymer of diallyl phthalate; and
   0.1 parts by mass to 30 parts by mass of a curl lessening component selected from the group consisting of
   2,4-diphenyl-4-methyl-1-pentene,
   lauryl mercaptan,
   octyl mercaptan,
   2-mercaptoethanol,
   octyl thioglycolate, and
   3-mercaptopropionic acid,
   wherein parts by mass are per 100 parts by mass of the styrene-modified polyphenylene ether compound.

2. The resin composition according to claim 1, further comprising 50 parts by mass to 600 parts by mass of dielectric particles per 100 parts by mass of the resin composition excluding the dielectric particles.

3. The resin composition according to claim 2, wherein the dielectric particles are composed of a composite oxide having a perovskite structure.

4. A metal foil provided with a resin layer on at least one side of the metal foil, wherein the resin layer is formed with the resin composition according to claim 1.

5. The metal foil provided with a resin layer according to claim 4, wherein the resin layer is used as a dielectric layer.

6. A printed wiring board formed by using the metal foil according to claim 4.

7. A metal clad laminate comprising a resin layer formed by using the resin composition according to claim 1 and a metal layer.

8. A printed wiring board formed by using the metal clad laminate according to claim 7.

9. A resin composition used for constituting a resin layer of a laminate in which the resin layer is provided on a metal layer surface, the resin composition comprising
   a styrene-modified polyphenylene ether compound obtained from reacting a polyphenylene ether compound with chloromethyl styrene;
   10 parts by mass to 100 parts by mass of a styrene-butadiene block copolymer;
   0.1 parts by mass to 100 parts by mass of a component promoting solubility of the resin composition with a desmear solution, wherein the component is a polymer of diallyl phthalate; and
   0.1 parts by mass to 30 parts by mass of 2,4-diphenyl-4-methyl-1-pentene as a curl lessening component,
   wherein parts by mass are per 100 parts by mass of the styrene-modified polyphenylene ether compound.

10. The resin composition according to claim 9, further comprising 50 parts by mass to 600 parts by mass of dielectric particles per 100 parts by mass of the resin composition excluding the dielectric particles.

11. The resin composition according to claim 10, wherein the dielectric particles are composed of a composite oxide having a perovskite structure.

* * * * *